United States Patent
Takahashi et al.

[11] Patent Number: 5,561,366
[45] Date of Patent: * Oct. 1, 1996

[54] CURRENT SENSOR SYSTEM AND DETECTION METHOD COMPRISING MAGETORESISTANCE ELEMENT, BIASING CONDUCTOR AND CURRENT MEASUREMENT CONDUCTOR ON INSULATING SUBSTRATE

[75] Inventors: Tadashi Takahashi; Syooichi Kawamata; Shigeki Morinaga, all of Hitachi, Japan

[73] Assignee: Hitachi, Ltd., Tokyo, Japan

[ * ] Notice: The portion of the term of this patent subsequent to Jun. 8, 2000, has been disclaimed.

[21] Appl. No.: 964,891

[22] Filed: Oct. 22, 1992

[30] Foreign Application Priority Data

Oct. 22, 1991 [JP] Japan ................................ 3-273717

[51] Int. Cl.$^6$ .......................... G01R 33/06; G01R 33/00
[52] U.S. Cl. ........................... 324/117 R; 324/252
[58] Field of Search .................... 338/324; 307/309; 324/117 R, 117 H, 126, 250–254

[56] References Cited

U.S. PATENT DOCUMENTS

| | | | |
|---|---|---|---|
| 4,343,026 | 8/1982 | Griffith et al. | 360/113 |
| 4,596,950 | 6/1986 | Lienhard et al. | 324/117 |
| 4,691,259 | 9/1987 | Imakoshi et al. | 360/113 |
| 4,823,075 | 4/1989 | Alley | 324/117 R |
| 4,939,448 | 7/1990 | Gudel | 324/117 R |
| 4,939,449 | 7/1990 | Callaneo et al. | 324/117 R |
| 5,049,809 | 10/1991 | Wakatsuki et al. | 324/117 R |
| 5,099,830 | 3/1992 | Kishimoto | 128/38 |
| 5,218,279 | 6/1993 | Sakahashi et al. | 318/560 |

FOREIGN PATENT DOCUMENTS

| | | |
|---|---|---|
| 3133908 | 8/1981 | European Pat. Off. . |
| 0181759 | 5/1986 | European Pat. Off. . |
| 0300635 | 1/1989 | European Pat. Off. . |
| 0154680 | 9/1983 | Japan .................... 324/252 |

Primary Examiner—Kenneth A. Wieder
Assistant Examiner—Barry C. Bowser
Attorney, Agent, or Firm—Antonelli, Terry, Stout & Kraus

[57] ABSTRACT

The object of the present invention is to provide a small precise insulating type current sensor system.

Sensing portion is composed of a magnetoresistance element, a bias conductor, and a current conductor, all of which are arranged on an insulating substrate. Resistance change of the magnetoresistance element is taken into an amplifier, and an output of the amplifier flows as a bias current to the bias conductor. When a current flows in the current conductor, the current causes a magnetic field and the resistance of the magnetoresistance element must be changed. However a feedback of the resistance change by the amplifier changes the bias current and controls the bias current for keeping the magnetic field of the magnetoresistance element at a constant. Accordingly, the insulation type current sensing with a wide range and preferable preciseness without being affected with a hysteresis of the magnetoresistance element and Barkhausen noise became possible.

8 Claims, 5 Drawing Sheets

CURRENT SENSOR SYSTEM AND DETECTION METHOD COMPRISING MAGETORESISTANCE ELEMENT, BIASING CONDUCTOR AND CURRENT MEASUREMENT CONDUCTOR ON INSULATING SUBSTRATE

BACKGROUND OF THE INVENTION

1. Field of the Invention

The present invention relates to a current sensor system utilizing ferromagnetic magnetoresistance elements and bias conductors, especially, to a current sensor system or a method for current detection utilizing bias conductors, current conductors, and magnetoresistance elements for the current sensor system.

2. Description of the Prior Art

A conventional current sensor system consists of a magnetoresistance element and a current conductor as described in a reference, C. H. Bajorek et al: A PERMALLOY CURRENT SENSOR: 813–815, Vol. MAG-12, No.6 IEEE Trans. Mag. (November, 1976), and detects electric current flowed in the current conductor as resistance change of the magnetoresistance element.

The above described prior art had such problems as insufficient accuracy of current detection and narrowness of current detecting range, because preventing measures against hysteresis of the magnetoresistance element and Barkhausen noise, and enlargement of the current detecting range were not considered.

SUMMARY OF THE INVENTION

1. Objects of the Invention

The objects of the present invention are to provide a current sensor system which can detect electric current in with high accuracy without generating hysteresis and Barkhausen noise by a magnetoresistance element, and further, to provide a composition which can extend a current detecting range.

2. Methods Solving the Problems

In order to achieve the above described objects, the present invention is realized by a current sensor system comprising an insulated substrate made of glass or ceramics, etc., a current conductor mounted on the insulated substrate, and a magnetoresistance element which is mounted on the insulated substrate and is arranged in parallel with the current conductor in a magnetic field generated by the current conductor so as to detect current flowed in the current conductor by utilizing magnetic characteristics of the magnetoresistance element, wherein a bias conductor is provided near the current conductor and in parallel to the magnetoresistance element, and a circuit, which flows current to cancel a change in a magnetic field which is generated by current flowing in the current conductor, is connected to the bias conductor so as to detect the current in the current conductor from the current value in the bias conductor.

A predetermined current flows in the bias conductor in order to add a bias magnetic field to the magnetoresistance element. When current flows in the current conductor under the above described condition, a magnetic field is Generated and a resistance of the magnetoresistance element has to be changed, but, the magnetic field of the magnetoresistance element can be controlled substantially at a constant by controlling the bias current so as to cancel the resistance change, and consequently, hysteresis and Barkhausen noise of the magnetoresistance element are not Generated. Further, as an operating point of the magnetoresistance element keeps a constant position, the element operates so as to make it possible to detect current in a wide range without restricting the range of current detection within an operating range of the magnetoresistance element.

DETAILED DESCRIPTION OF THE PREFERRED EMBODIMENTS OF THE INVENTION

Hereinafter, one of the preferable embodiments of the present invention is explained referring to FIG. 1.

Figure 1:
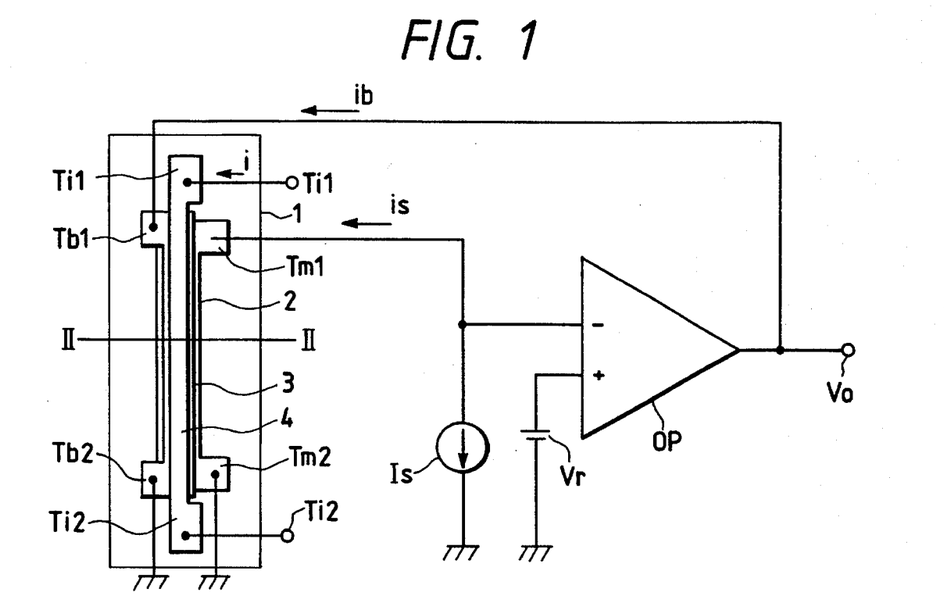
FIG. 1 is a schematic drawing indicating a composition of an embodiment of the present invention.

FIG. 1 indicates a composition of a current sensor system. Referring to FIG. 1, the insulated substrate 1 is composed from such insulating materials as glass, ceramics, and reinforced plastics etc. The magnetoresistance element (MR element) 2 is mounted on the substrate 1, and a bias conductor 3 is mounted, on the magnetoresistance elements 2, and further, a current conductor 4 is mounted on the bias conductor 3 to form a sensor portion. The MR element 2 has the terminals, Tml and Tm2, and is connected to a constant current source Is and is supplied with constant current, is.

The bias conductor 3 has the terminals, Tb1 and Tb2, and is connected to output from an amplifier (processing amplifier) OP, and is supplied with bias current ib.

The current conductor 4 has terminals, Ti1 and Ti2, and each of the terminals are supplied with a measured current from an external lead wire.

The the terminal Tm1 of the MR element 2 and a standard voltage Vr are connected to the respective input terminals of the amplifier OP.

Now, a case when a current at the current conductor 4 is zero with the above described composition is considered. The standard voltage Vr is charged to the output of the amplifier OP in order to generate an output voltage Vo0. Depending on the output voltage Vo0, a bias current, ib0, flows through the bias conductor 3 and a magnetic field Hb0 is added to the MR element. Next, another case when a current, i1, flows through the current conductor 4 is considered. Output of the amplifier becomes Vo1, and the output voltage Vo1 causes bias current, ib1, at the bias conductor, and further, current at the bias conductor is changed from Ib0 to Ib1 so as to cancel the magnetic field Hs1 generated by the current, i1, of the current conductor 4. Consequently, a magnetic field added to the MR element is Hb0 and a change of the magnetic field does not occur. Accordingly, a voltage change (from V00 to V01) which is proportional to the current at the current conductor 4 is added to the output terminal Vo as an output of the amplifier.

Figure 2:
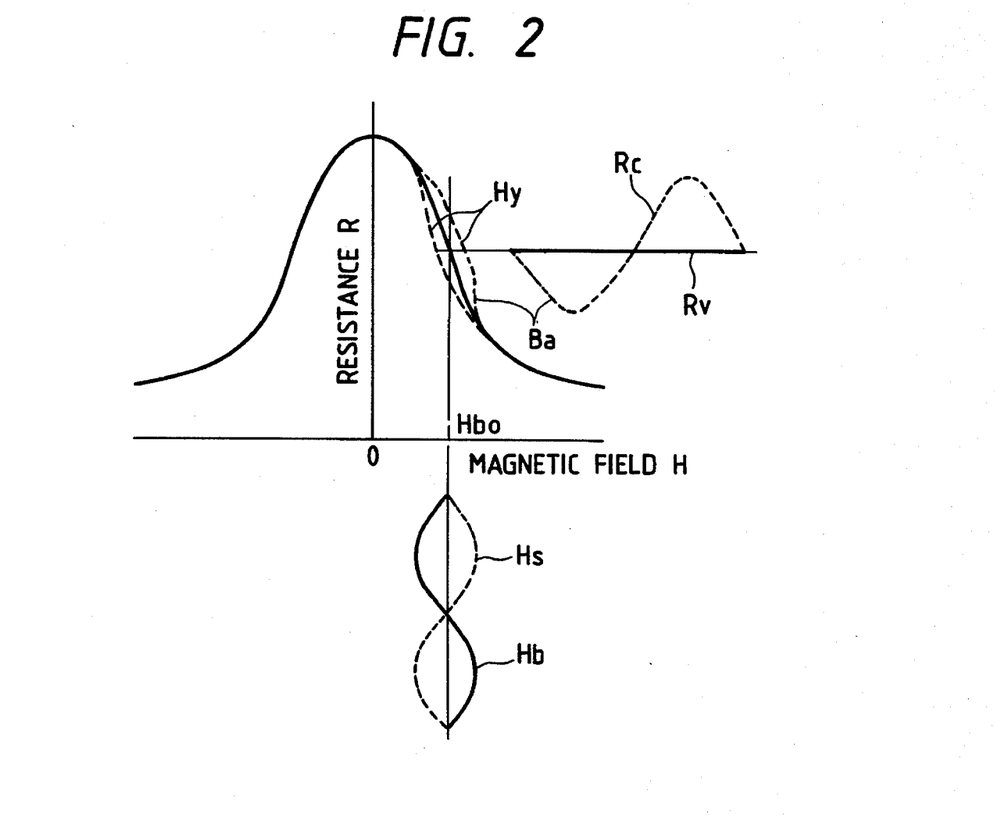
FIG. 2 is a graph of characteristics for explanation of an operation of the present invention.

Referring to FIG. 2, the above described operation is explained. FIG. 2 indicates a characteristics of resistance versus magnetic field of the MR element, the solid line indicates an ideal characteristics and the dashed line indicates the characteristics of another case with hysteresis and Barkhausen noise.

When current at the current conductor 4 is zero, the magnetic field which is added to the MR element is Hb0, and resistance of the MR element is Rv. Next, a case when a sine wave current, i, flows through the current conductor 4 is considered. In this case, the magnetic field Hs indicated by the dashed line in FIG. 2 is generated by the current, i, but the circuit previously described referring to FIG. 1 changes the bias magnetic field Hb indicated with the solid line by altering the current Ib of the bias conductor so as to cancel the magnetic field Hs, and consequently, resistance of the MR element is kept constant as indicated with solid line Rv because the magnetic field of the MR element is kept at an original Hb0. Further, because the magnetic field of the MR element changes as Hs without a canceling of the magnetic field Hs generated by current in a different case of a constant bias from such a case as a controlling of the bias magnetic field as the present invention, a resistance of the MR element becomes as Rc indicated with a dashed line in FIG. 2, and the sine wave which is put in by the input current can not be obtained by effects of hysteresis and Barkhausen noise.

Figure 3:
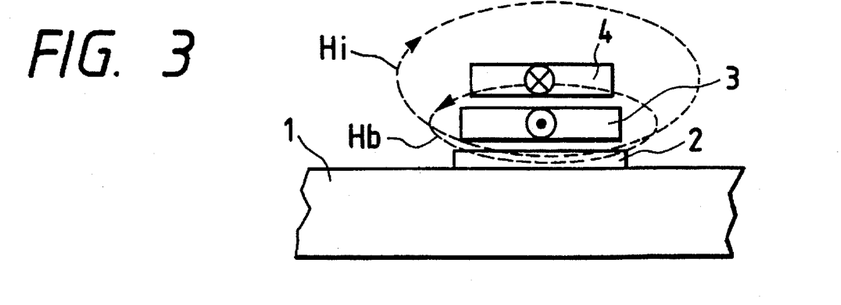
FIG. 3 is a section taken on line II—II in FIG. 1.

FIG. 3 is a section taken on line II—II in FIG. 1.

The magnetic field Hb indicated with a dashed line is generated by a flowing bias current in the bias conductor 3 in a direction shown in FIG. 3, and the magnetic field is added to the MR element 2. When current flows in the current conductor 4 in a direction shown in FIG. 3, the magnetic field Hi as indicated with a dashed line is added to the MR element 2.

In accordance with the present invention, the magnetic field added to the MR element is operated to be always constant and an output proportional to a sensing current can be obtained, and consequently, wide range and precise insulated type current sensing without being effected by hysteresis and Barkhausen noise of the MR element becomes available, and simplification of structure and miniaturization of current sensor systems become possible. Further, because conductors are not arranged in coil states but in stripes states, inductance can be small, and such an effect that current sensing with preferable frequency characteristics is realized.

Figure 4:
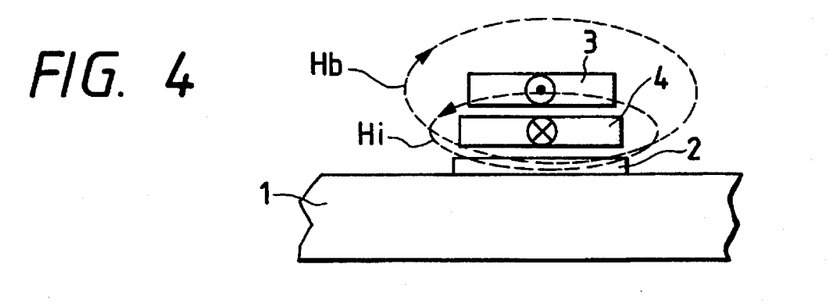
FIG. 4 is a section in one of other embodiments.

FIG. 4 is a drawing for explanation of one of other embodiments combination of the present invention, but being useful for measurement of small currents.

Owing to the fact that a MR element has temperature characteristics and internal resistance changes depending on temperature, a small temperature raise by current flow is preferable. The composition shown in FIG. 4 is an example of mutual substitution of the current conductor position with the bias conductor in FIG. 3, and the composition is appropriate for measurement of small current. That means, as the current conductor can be placed close to the MR element and the magnetic field added to the MR element can be increased with a smaller current than shown in FIG. 3, an effect of increasing sensitivity can be realized.

Figure 5:
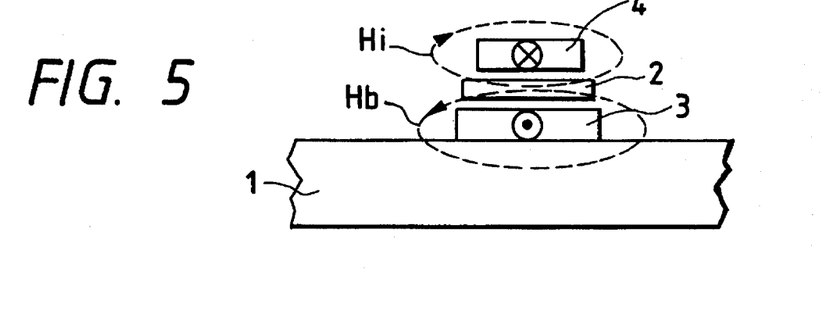
FIG. 5 is a section in One of other embodiments.

FIG. 5 is a drawing indicating one of another small current measurement embodiment not including the inventive combination of the present invention and is an example wherein positions of the MR element, the current conductor, and the bias conductor in FIG. 3 are substituted with each other and the MR element is arranged at the middle of the above described members.

In accordance with the above described arrangement, both of the current conductor and the bias conductor are arranged close to the MR element respectively. Accordingly, such an effect can be realized that sensitivity of current can be increased larger than the composition shown in FIG. 3 and the bias current can be decreased less than the composition shown in FIG. 4. The same effect can be realized by substitution of positions of the current conductor and the bias conductor shown in FIG. 5.

Figure 6:
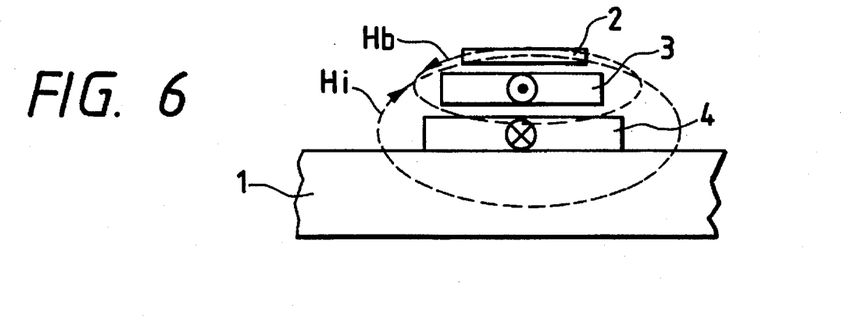
FIG. 6 is a section in one of other embodiments.

FIG. 6 is a drawing indicating one of another small current measurement embodiment not including the inventive combination of the present invention and is an example wherein positions of the MR element, the current conductor, and the bias conductor in FIG. 3 are substituted with each other and the MR element is arranged at a top of the above described members.

In accordance with the above described arrangement, the heat which is generated by current through the current conductor can easily flow through the substrate 1, and temperature a rise at the sensing portion can be reduced.

Figure 7:
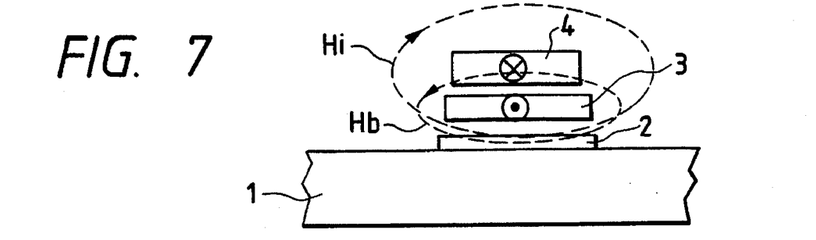
FIG. 7 is a section in one of other embodiments.

FIG. 7 is a drawing indicating one of other embodiments, wherein a thickness of the current conductor 4 which flows a larger current than the bias conductor 3 in the composition shown in FIG. 3 is made thicker than a thickness of the bias conductor 3 in order to decrease an electric resistance for reducing heat generation by current. Similar effect to reduce heat generation by current is realized by making a thickness of the bias conductor 3 which flows a larger current than a the MR element thicker than thickness of the MR element.

Figure 8:
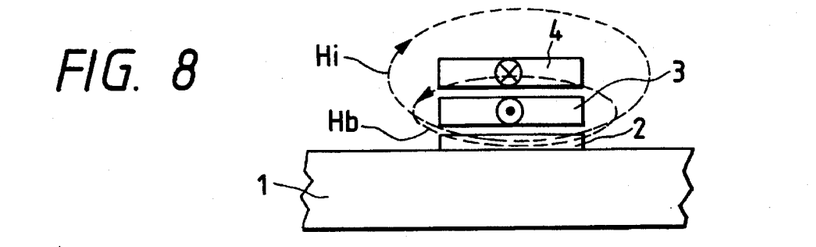
FIG. 8 is a section in one of other embodiments.

FIG. 8 shows one of other embodiments, wherein an effect to facilitate manufacturing of the sensor by making widths of the current conductor 4, the bias conductor, and the MR element same in the composition shown in FIG. 3 is realized.

Figure 9:
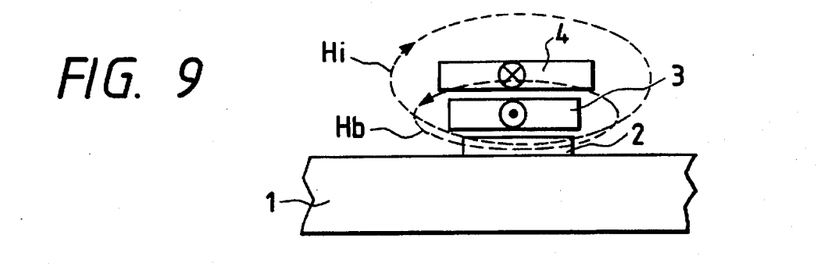
FIG. 9 is a section in one of other embodiments.

FIG. 9 is another embodiment, wherein an effect to reduce heat generation and temperature raise by decreasing electric resistance by making widths of the conductors larger in order of current flow in the composition shown in FIG. 3 is realized. Further, owing to making a width of the bias conductor wider than the MR element, a bias magnetic field can be effectively added to the MR element. Moreover, a magnetic field generated by the current conductor and the bias magnetic field can be effectively added to the MR element by making a width of the current conductor which is located furthest from the MR element largest and making a width of the bias conductor next large.

Figure 10:
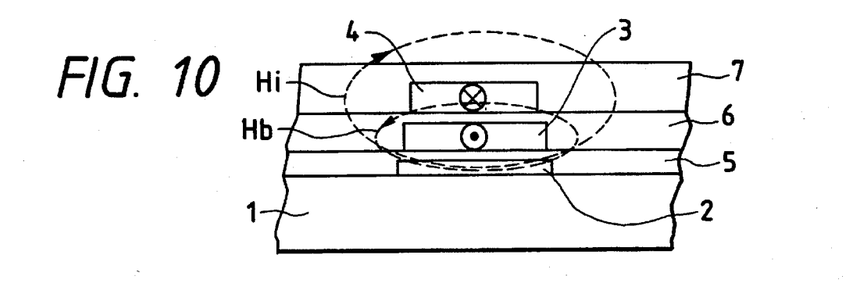
FIG. 10 is a section in one of other embodiments.

FIG. 10 is one of other embodiments, wherein the insulating members 5, 6, 7, are respectively arranged among the MR element 2, the bias conductor 3, and the current conductor 4 in a composition shown in FIG. 3. As for the insulating members 5, 6, 7, materials such as SiO₂, resin, etc. are usable, and not only a monolayer but also double layers such as $SiO_2$ and resin has an effect to enhance an insulating property much.

Figure 11:
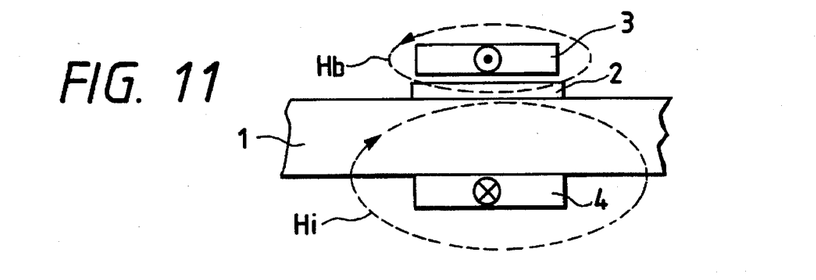
FIG. 11 is a section in one of other embodiments.

FIG. 11 is one of other embodiments of a composition used for a case when the detecting current is large, or when dielectric strength between an electric current detecting terminal and the bias conductor or the MR element must be kept high. In the composition, the current conductor 4 is arranged at a reversed side of the substrate1 with respect to the MR element placing the substrate 1 between. In accordance with the above described composition, intervals among the MR element, the bias conductor, and the current conductor become wider, and sensing of a large current becomes possible because a magnetic field generated by the large current can be made small. Further, the dielectric strength of the current conductor and the MR element can be increased. Moreover, as heat generation of the current conductor which flows a large current can be absorbed by the substrate 1, an effect to reduce a temperature raise is realized.

Figure 12:
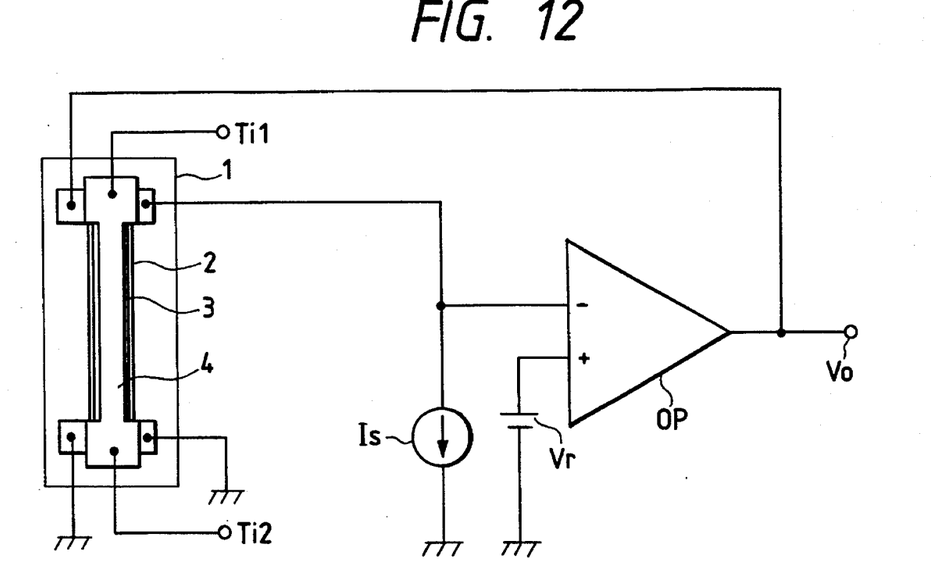
FIG. 12 is a schematic drawing indicating a composition of another embodiment of the present invention.

FIG. 12 illustrates one of other embodiments, which is an example wherein a respective length of the MR element, the bias conductor, and the current conductor at a sensing portion shown in FIG. 1 are made the same. In accordance with the composition, magnetic fields generated by respective conductors can be effectively added to the MR element.

Figure 13:
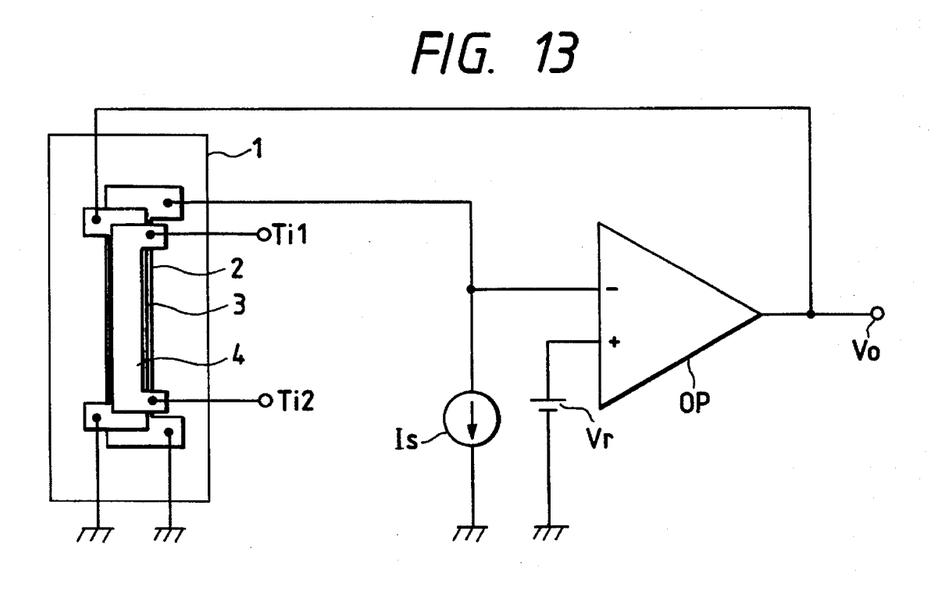
FIG. 13 is a schematic drawing indicating a composition in one of other embodiments of the present invention.

FIG. 13 illustrates one of other embodiments, which is a composition wherein a respective length of the MR element, the bias conductor, and the current conductor at a sensing portion shown in FIG. 1 are made shorter in order of coming upwards. In accordance with the composition, edge portions of the conductors are not overlapped, and an effect to prevent a cutting of the conductor arranged at an upper level by a difference of level at the edge portions of the conductor arranged at a lower level in manufacturing is realized.

Figure 14:
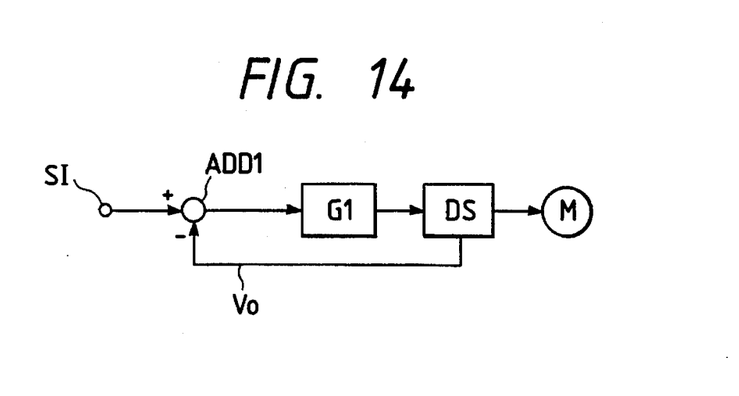
FIG. 14 is a schematic drawing indicating a composition of an embodiment applied to motor control of the present invention.

FIG. 14 is one of other embodiments, and is an example of the current sensor system application to current control of a motor.

A deviation between the current instruction SI and the output V0 from the current sensor system DS connected to the motor is taken at the additive point ADD1, and an output from the additive point is amplified by G1 times and used for driving the motor. Accordingly, as the composition operates so as to make the deviation at the additive point zero, the motor current is controlled so as to be equal to the instruction current. As for the above described current sensor system, such sensors as shown in FIGS. 1 through 13 are used, and consequently, preciseness of current sensing is improved and preferably precise control of a motor becomes possible. Further, size of the current sensor system becomes small, and an arrangement of the current sensor system on a printed circuit substrate with a motor control circuit becomes possible.

Figure 15:
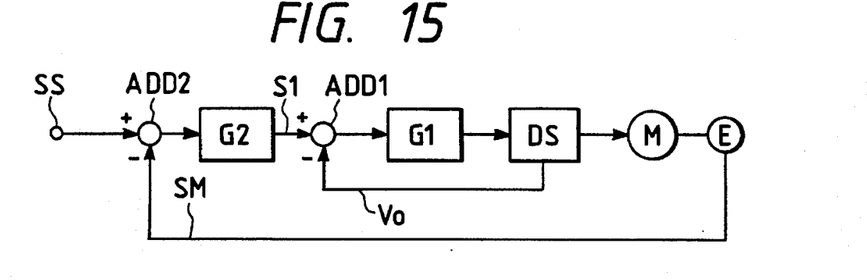
FIG. 15 is a schematic drawing indicating a composition in one of other embodiments applied to motor control of the present invention.

FIG. 15 is a drawing indicating one of other embodiments, and is an example of an application to a speed controlling apparatus.

A deviation between the speed instruction SS and the speed signal SM from the encoder E for detecting speed of a motor is taken at the additive point ADD2 by comparison, and the current instruction SI is made by multiplying the deviation by the coefficient G2. Next, a deviation between the current instruction SI and the output V0 from the current sensor system DS which is connected to a motor circuit is taken at the additive point ADD1, and an output from the additive point is amplified by G1 times and used for driving the motor. Accordingly, as the composition operates so as to make the deviation at the additive point ADD2 zero, the motor speed is controlled so as to be equal to the instruction speed SS. As for the above described current sensor system, such sensors as shown in FIGS. 1 through 13 are used, and consequently, preciseness of current sensing is improved and preferably precise control of speed becomes possible. Further, size of the current sensor system becomes small, and an arrangement of the current sensor system on a printed circuit substrate with a motor control circuit becomes possible.

Figure 16:
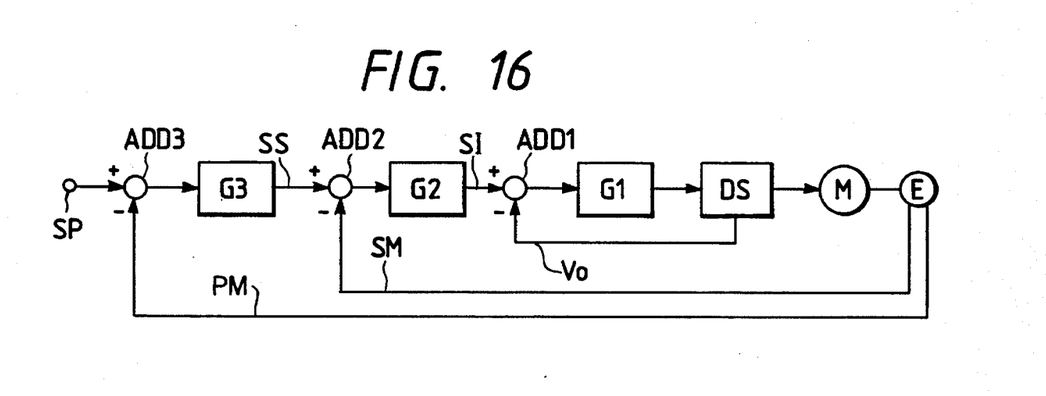
FIG. 16 is a schematic drawing indicating a composition in one of other embodiments applied to motor control of the present invention.

FIG. 16 is a drawing indicating one of other embodiments, and is an example of an application to a position controlling apparatus.

A deviation between the position instruction SP and the position signal PM from the encoder E for detecting a position of a motor is taken at the additive point ADD3 by comparison, and the speed instruction SS is made by multiplying the deviation by the coefficient G3. Next, a deviation between the speed instruction SS and the speed signal SM from the encoder E for detecting speed of a motor is taken at the additive point ADD2 by comparison, and the current instruction SI is made by multiplying the deviation by the coefficient G2. Subsequently, a deviation between the current instruction SI and the output V0 from the current sensor system DS which is connected to a motor circuit is taken at the additive point ADD1, and an output from the additive point is amplified by G1 times and used for driving the motor. Accordingly, as the composition operates so as to make the deviation at the additive point ADD3 zero, the motor position is controlled so as to be equal to the instruction position SP. As for the above described current sensor system, such sensors as shown in FIGS. 1 and 13 are used, and consequently, preciseness of current sensing is improved and preferably precise control of position becomes possible. Further, size of the current sensor system becomes small, and an arrangement of the current sensor system on a print substrate with a motor control circuit becomes possible.

In accordance with the present invention, a current sensor system which is composed of an insulating substrate made from glass or ceramics, a current conductor mounted on the insulating substrate, and a magnetoresistance element which is arranged on the same insulating substrate in parallel with the current conductor in a magnetic field generated by the current conductor, so as to detect current through the current conductor by utilizing magnetic characteristics of the magnetoresistance element, wherein a bias conductor is provided near the current conductor and in parallel to the magnetoresistance element, a circuit for current to cancel a variation of the magnetic field caused by the current through the current conductor is connected to the bias conductor and composed so as to detect current through the current conductor from the value of current through the bias conductor, or a method for detecting current in the same manner above described is realized. Accordingly, an output proportional to a sensing current can be obtained by an operation to make an internal resistance of the magnetoresistance element always constant, and an insulated type current detection in a wide range with preferable preciseness without being affected by a hysteresis of the magnetoresistance element and Barkhausen noise becomes possible.

As for concomitant effects, the following advantages are realized.

That is, the current sensor system relating to the present invention has a simple composition, and miniaturization becomes possible. Farther, an inductance can be small because all of the conductors are not arranged in a form of coils, and accordingly, current detection with a preferable frequency characteristics is realized.

Because of a close arrangement of the current conductor to the magnetoresistance element, a magnetic field added to the MR element can be large even with a small current, and sensitivity can be improved.

Heat which is generated by the current through the current conductor can be easily released through the substrate 1, and a temperature rise at the sensing portion can be reduced.

Further, another effect for reducing temperature raise can be realized by making widths of the conductors wide in an order of an amount of current flow for decreasing heat generation.

As a width of the bias conductor is made wider than that of the magnetoresistance element, a bias magnetic field can be effectively added to the magnetoresistance element. Further, by making the width of the current conductor which is separated from the magnetoresistance element widest and making a width of the bias conductor next wide, an effect wherein a magnetic field generated by the current conductor and the bias magnetic field can be effectively added to the magnetoresistance element is realized.

A structure wherein the current conductor 4 is arranged at a reverse side of a substrate with respect to the magnetoresistance element placing the substrate 1 between makes it possible to increase a width of intervals between the magnetoresistance element, the bias conductor, and the current conductor, and accordingly, a large current can be detected because the magnetic field added to the MR element can be small even with the large current.

Dielectric strength of the current conductor and the magnetoresistance element can be improved. Moreover, an effect for reducing temperature rise of the magnetoresistance element is realized because heat generation at the current conductor with a large current can be absorbed by the substrate 1.

Further, an industrial advantage for making it possible to obtain precise miniaturized control circuits by application of the present invention to motor control is distinguished.

What is claimed is:

1. A sensor system for detecting an electric current, said system comprising:

an insulating substrate, a magnetoresistive element which is arranged on said insulating substrate a bias conductor arranged in parallel to said magnetoresistive element on said magnetoresistive element, a current conductor having terminals supplied with a subject current to be measured from an external lead wire, said current conductor being arranged outside of the position between the insulating substrate and said bias conductor and in parallel to the magnetoresistive dement, and a circuit for flowing a cancelling current into said bias conductor for cancelling variation of magnetic field caused by said subject current flowing through said current conductor to hold said magnetoresistive element to a substantially constant resistance which is less than a maximum resistance thereof, so as to detect said subject current flowing through said current conductor from a value of said cancelling current applied to said bias conductor.

2. A sensor system for detecting an electric current, said system comprising:

an insulating substrate made from glass or ceramics, a magnetoresistive dement which is arranged on said insulating substrate, a bias conductor arranged in parallel to and on said magnetoresistance element, a current conductor having terminals supplied with a subject current to be measured from an external lead wire, said current conductor being arranged outside of the position between the insulating substrate and said bias conductor and in parallel to the magnetoresistive element, and a circuit for flowing a cancelling current into said bias conductor for cancelling variation of resistance caused by a changing of magnetic field depending on a changing of said subject current flowing through said current conductor to hold said magnetoresistive element to a substantially constant resistance which is less than a maximum resistance thereof, so as to detect said subject current flowing through said current conductor from a value of said cancelling current applied to said bias conductor.

3. A method of detecting an electric current flowing in a current conductor of a sensor system which has an insulating substrate made of glass or ceramics, is arranged on said insulating substrate a bias conductor which is arranged in parallel to and on said magnetoresistive element, and a current conductor having terminals supplied with measured current from an external lead wire, said current conductor being arranged outside of the position between the insulating substrate and said bias conductor and in parallel to the magnetoresistive element, said method comprising the steps off, flowing a cancelling current into said bias conductor for cancelling variation of magnetic field caused by said subject current flowing through said current conductor to hold said magnetoresistive element to a substantially constant resistance which is less than a maximum resistance thereof, and detecting said subject current flowing through said current conductor from a value of said cancelling current flowing through said bias conductor.

4. A method of detecting an electric current flowing in a current conductor of a sensor system which has an insulating substrate made of glass or ceramics, a magnetoresistive element which is arranged on said insulating substrate, and a bias conductor which is arranged in parallel to and on said magnetoresistive element, and a current conductor having terminals supplied with measured current from an external lead wire, said current conductor being arranged outside of the position between the insulating substrate and said bias conductor and in parallel to the magnetoresistive element, said method comprising the steps of, flowing a cancelling current into said bias conductor for cancelling a variation of resistance caused by a changing of magnetic field depending on a changing of said subject current flowing through said current conductor to hold said magnetoresistive element to a substantially constant resistance which is less than a maximum resistance thereof, and detecting said subject current flowing through said current conductor from a value of said cancelling current flowing through said bias conductor.

5. A sensor system as claimed in claim 1, wherein said insulating substrate is made from at least one of a glass and ceramic material.

6. A magnetoresistive sensor system for detecting an electric current, said system comprising:

an insulating substrate, a magnetoresistive element having a longitudinal stripe shape which is arranged on said insulating substrate a bias conductor having a longitudinal stripe shape arranged in parallel to said magnetoresistive element on said magnetoresistive element, a current conductor having terminals supplied with a subject current to be measured from an external lead wire, said current conductor being arranged outside of the position between the insulating substrate and said bias conductor and in parallel to the magnetoresistive element, and a circuit for flowing a cancelling current into said bias conductor for cancelling variation of magnetic field caused by said subject current flowing through said current conductor to hold said magnetoresistive element to a substantially constant resistance which is less than a maximum resistance thereof, so as to detect said subject current flowing through said current conductor from a value of said cancelling current applied to said bias conductor.

7. A sensor system for detecting an electric current, said system comprising:

printed circuit substrate, a magnetoresistive element which is arranged on said printed circuit substrate, a bias conductor arranged in parallel to and on said magnetoresistive elements, a current conductor having terminals supplied with a subject current to be measured from an external lead wire, said current conductor being arranged outside of the position between the printed circuit substrate and said bias conductor and in parallel to the magnetoresistive dement, and a circuit for flowing a cancelling current into said bias conductor for cancelling variation of magnetic field caused by said subject current flowing through said current conductor to hold said magnetoresistive element to a substantially constant resistance which is less than a maximum resistance thereof, so as to detect said subject current flowing through said current conductor from a value of said cancelling current applied to said bias conductor.

8. A magnetoresistive sensor system as claimed in claim 7, wherein said magnetoresistive element is at least partially composed of ferromagnetic material.

* * * * *

UNITED STATES PATENT AND TRADEMARK OFFICE
CERTIFICATE OF CORRECTION

PATENT NO. : 5,561,366
DATED : October 1, 1996
INVENTOR(S) : TAKAHASHI et al.

It is certified that error appears in the above-indentified patent and that said Letters Patent is hereby corrected as shown below:

Title page: item [*]
Notice: The portion of the term of this patent subsequent to January 7, 2011, has been disclaimed.

Signed and Sealed this

First Day of July, 1997

Attest:

Attesting Officer

BRUCE LEHMAN

Commissioner of Patents and Trademarks